US008629472B2

(12) United States Patent
Seo et al.

(10) Patent No.: US 8,629,472 B2
(45) Date of Patent: Jan. 14, 2014

(54) LIGHT-EMITTING DEVICE, ELECTRONIC DEVICE, AND LIGHTING DEVICE

(75) Inventors: Satoshi Seo, Kanagawa (JP); Kaoru Hatano, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 47 days.

(21) Appl. No.: 13/306,504

(22) Filed: Nov. 29, 2011

(65) Prior Publication Data

US 2012/0146025 A1  Jun. 14, 2012

(30) Foreign Application Priority Data

Dec. 2, 2010 (JP) ................................ 2010-269697

(51) Int. Cl.
*H01L 33/00* (2010.01)
(52) U.S. Cl.
USPC ................. 257/98; 257/88; 257/89; 257/99; 257/E33.061; 313/503; 313/506
(58) Field of Classification Search
USPC ............... 257/12–13, 88–89, 98–99, 103, 257/184–187, 225, 432, 440; 438/22, 438/48–52; 313/26, 503–504, 506
See application file for complete search history.

(56) References Cited

U.S. PATENT DOCUMENTS

| 6,831,408 B2 | 12/2004 | Hirano | |
| 2004/0046184 A1* | 3/2004 | Yanagawa et al. | 257/200 |
| 2008/0081389 A1* | 4/2008 | Matsukaze | 438/29 |
| 2010/0253819 A1* | 10/2010 | Yokozawa | 348/273 |

FOREIGN PATENT DOCUMENTS

| JP | 11-295725 | 10/1999 |
| JP | 2001-43980 | 2/2001 |
| JP | 2008-164851 | 7/2008 |

* cited by examiner

*Primary Examiner* — Dung A. Le
(74) *Attorney, Agent, or Firm* — Husch Blackwell LLP

(57) ABSTRACT

A light energy reuse type light-emitting device with low power consumption is provided by converting light from a light-emitting device into electric power efficiently for reuse. Also, a light energy reuse type light-emitting device with high yield is provided. A light-blocking film of the light-emitting device is replaced to a photoelectric conversion element, so that light is converted into electric power. That is, conventionally, light is not emitted in a portion of a light-blocking film. In the disclosed invention, light which is not emitted can be converted into electric power by a photoelectric conversion element, and can be reused. Therefore, a light-emitting device with low power consumption is realized.

12 Claims, 8 Drawing Sheets

LIGHT-EMITTING DEVICE, ELECTRONIC DEVICE, AND LIGHTING DEVICE

BACKGROUND OF THE INVENTION

1. Field of the Invention

An embodiment of the present invention relates to a light-emitting device utilizing electroluminescence. Further, an embodiment of the present invention relates to an electronic device and a lighting device which utilize the light-emitting device.

2. Description of the Related Art

In recent years, research and development have been extensively conducted on light-emitting elements using electroluminescence (hereinafter, referred to as EL). In a basic structure of such a light-emitting element, a layer containing a substance with a light-emitting property is interposed between a pair of electrodes. By applying a voltage to this element, light emission from the light-emitting substance can be obtained.

Since the above light-emitting element is a self-luminous type, a light-emitting device using this light-emitting element has advantages such as high visibility, no necessity of a backlight, low power consumption, and the like. Further, such a light-emitting element also has advantages in that the element can be formed to be thin and lightweight, and that response time is high.

For example, in the case where the light-emitting element is applied to an active matrix light-emitting device, a light-emitting element is formed over a substrate in which a transistor or the like controlling light emission is formed in some cases. With such a structure (bottom-emission structure) where light emitted from a light-emitting element is extracted to outside through a substrate in which a transistor or the like is formed, there is a problem in that an aperture ratio becomes low depending on a wiring, a transistor, or the like.

In order to solve this problem, a structure (top-emission structure) where light is extracted from the side opposite to an element substrate is proposed (see Patent Document 1, for example). By using a top-emission structure, the aperture ratio can be increased, and the extraction efficiency of light can be increased, which are advantageous to low power consumption and high definition.

In the light-emitting device, a coloring method in which light-emitting elements emitting red, green or blue light are arranged in matrix and a coloring method with a colored layer (that is, a color filter) using a light-emitting element emitting white light are used. In the case of the coloring method with a color filter, a black matrix (BM) which is a light-blocking film is provided to prevent each color from being mixed or improve contrast.

However, light from the light-emitting element provided in the light-emitting device is partially absorbed in the black matrix (BM), and the light-extraction efficiency is decreased. Electric power is required to increase the light-extraction efficiency; thus, there is a problem in that power consumption is increased.

In order to solve this problem, a display device including a solar cell with low power consumption is proposed (Patent Document 2 and Patent Document 3, for example).

[Reference]

[Patent Document 1] Japanese Published Patent Application No. 2001-043980

[Patent Document 2] Japanese Published Patent Application No. H11-295725

[Patent Document 3] Japanese Published Patent Application No. 2008-164851

SUMMARY OF THE INVENTION

In Patent Document 2 and Patent Document 3, a solar cell is arranged separately from a display device and light from a backlight provided in the display device enters the solar cell, so that electricity is generated by the light which enters the solar cell. A technology in which the generated electricity is fed back to the display device so that power consumption of display device is reduced has been shown. However, because the solar cell needs to be formed in addition to the display device, steps become complicated. Therefore, there is a problem of low yield. Further, because the power consumption of the backlight is higher than the electric power generated by the solar cell, light from the backlight can not be collected efficiently.

In view of the above problems, an object of an embodiment of the present invention disclosed in this specification and the like is to provide a light energy reuse type light-emitting device with low power consumption, from which light (light energy) is converted into electric power efficiently.

Further, in view of the above problems, an object of an embodiment of the present invention disclosed in this specification and the like is to provide a light energy reuse type light-emitting device with high yield.

In an embodiment of the present invention disclosed in this specification and the like, a light-blocking film of a light-emitting device is replaced with a photoelectric conversion element so that light is converted into electric power. That is, light is not conventionally emitted in a portion of a light-blocking film. However, in the disclosed invention, light which is not emitted can be converted into electric power by a photoelectric conversion element, and can be reused. Therefore, the light-emitting device with low power consumption can be realized. Details thereof will be described below.

A light-emitting device of an embodiment of the present invention includes a first electrode, a second electrode, a first substrate provided with a light-emitting element formed using an organic EL layer sandwiched between the first electrode and the second electrode, and a second substrate provided with a colored layer and a photoelectric conversion element. The colored layer is provided to face the light-emitting element and has a light-transmitting property with respect to light emitted from the light-emitting element which has a particular wave length. The photoelectric conversion element is provided so as to surround the peripheral portion of the colored layer so that the light emitted from the light-emitting element is blocked. Further, the light from the light-emitting element is emitted from the second substrate side.

Further, a light-emitting device of an embodiment of the present invention includes a first electrode, a second electrode, a first substrate provided with a light-emitting element formed using an organic EL layer sandwiched between the first electrode and the second electrode, a second substrate provided with a colored layer and a photoelectric conversion element, a light-emission control circuit providing electric power to the light-emitting element, and a power storage portion storing electromotive force of the photoelectric conversion element. The colored layer is provided to face the light-emitting element and has a light-transmitting property with respect to light emitted from the light-emitting element which has a particular wave length. The photoelectric conversion element is provided so as to surround the peripheral portion of the colored layer so that the light emitted from the light-emitting element is blocked. Further, the light from the light-emitting element is emitted from the second substrate side.

In the structure, the first electrode may be formed using a material selected from aluminum, an alloy of aluminum, and silver. When the first electrode is formed using a material selected from aluminum, an alloy of aluminum, and silver, the organic EL layer can emit light efficiently.

Further, in the structure, the photoelectric conversion element may be formed using amorphous silicon including a pin junction or a single crystal semiconductor including a pin junction.

An embodiment of the present invention is an electronic device or a lighting device each using a light-emitting device having the above structure.

Note that in this specification and the like, the light-emitting device includes an image display device, a light-emitting device, a light source, a lighting device, and the like. Further, the light-emitting device includes a module in which a connector (FPC: flexible printed circuit) or the like is attached to a panel where a light-emitting element is formed.

Further, in this specification and the like, a solar cell is included in a photoelectric conversion element, and a color filter is included in a colored layer.

Note that in this specification and the like, the term "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term "electrode" or "wiring" does not limit a function of a component. For example, an "electrode" is used as part of a "wiring" in some cases, and vice versa. Furthermore, the term "electrode" or "wiring" can include the case where a plurality of "electrodes" or "wirings" is formed integrally.

Further, functions of a "source" and a "drain" are sometimes interchanged with each other when a transistor of opposite polarity is used or when the direction of current flow is changed in circuit operation, for example. Therefore, the term "source" or "drain" can be used to denote the drain and the source, respectively, in this specification.

By converting light from a light-emitting device into electric power efficiently for reuse, a light energy reuse type light-emitting device with low power consumption can be provided.

Further, with the use of such a light-emitting device, environmental load can be reduced.

Furthermore, a light energy reuse type light-emitting device with high yield can be provided.

BRIEF DESCRIPTION OF THE DRAWINGS

In the accompanying drawings.

DETAILED DESCRIPTION OF THE INVENTION

Figure 1A:
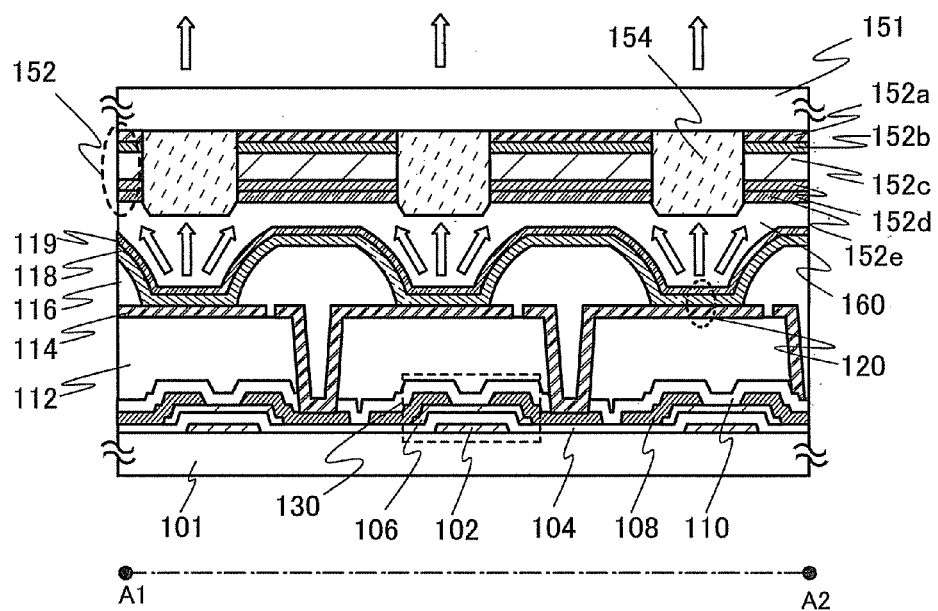
FIGS. 1A to 1C are diagrams illustrating a light-emitting device.

Hereinafter, Embodiments will be described in detail using the drawings. Note that the present invention is not limited to the embodiments described below, and it is apparent to those skilled in the art that modes and details can be modified in various ways without departing from the spirit of the present invention disclosed in this specification and the like. A structure of the different embodiment can be implemented in appropriate combination. In the description of the present invention, a reference numeral indicating the same part or a part having a similar function is used in common in the specification, and the repeated description thereof is omitted.

Note that the position, the size, the range, or the like of each structure illustrated in the drawings and the like is not accurately represented in some cases for easy understanding. Therefore, the present invention is not necessarily limited to the position, size, range, or the like disclosed in the drawings and the like.

In this specification and the like, ordinal numbers such as "first", "second", "third", and the like are used in order to avoid confusion among components, and the terms do not limit the components numerically.

(Embodiment 1)

In this embodiment, a display device which is one embodiment of a light-emitting device of the present invention will be described with reference to FIGS. 1A to 1C.

<Display Device>

Figure 1B:
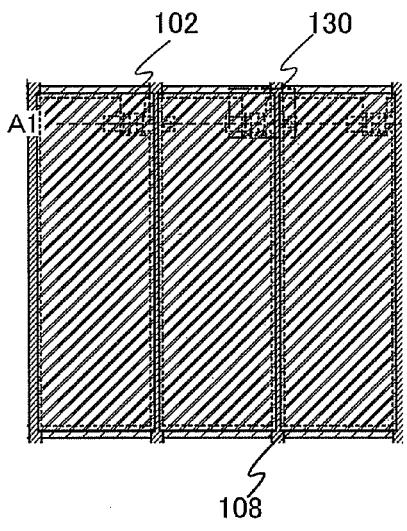
Figure 1C:
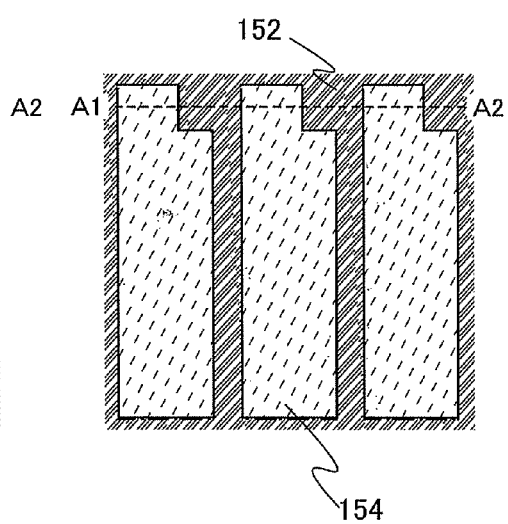

FIGS. 1A to 1C are diagrams corresponding to some pixels of a light-emitting device. Note that in this embodiment, the some pixels shown in FIGS. 1A to 1C is included in a light-emitting device.

A light-emitting device shown in FIG. 1A emits light in a direction indicated by arrows shown in FIG. 1A. That is, the light-emitting device has a so-called top-emission structure in which light is emitted not through a first substrate 101 provided with a light-emitting element 120, but through a second substrate 151.

FIG. 1B is a plan view of the first substrate 101 side of the light-emitting device. FIG. 1C corresponds a plan view of the second substrate 151 side of the light-emitting device. FIG. 1A is a cross-sectional view taken along a line A1-A2 in FIGS. 1B and 1C. Note that in the plan views in FIGS. 1B and 1C, some components (for example, the light-emitting element 120) of the present invention are omitted in order to avoid complex views.

As shown in FIG. 1A, the first substrate 101 is provided with a transistor 130 controlling driving of a light-emitting element and the light-emitting element 120 including a first electrode 114, an organic EL layer 118, and a second electrode 119, and the second substrate 151 is provided with a photoelectric conversion element 152 and a color filter 154. Light from the light-emitting element 120 is emitted to the second substrate 151 side, and then, the light is absorbed and transmitted by the color filter 154, or is absorbed by the photoelectric conversion element 152.

The photoelectric conversion element 152 has a light-blocking function (a so-called black matrix function). In this embodiment, ah example in which the photoelectric conversion element 152 is formed by stacking a third electrode 152a, a p-type semiconductor layer 152b, an i-type semiconductor layer (intrinsic semiconductor layer) 152c, an n-type semiconductor layer 152d, and a fourth electrode 152e will be described. The photoelectric conversion element 152 preferably has a structure having absorption sensitivity to a wavelength region of the light-emitting element 120 because light from the light-emitting element 120 can be converted into electric power efficiently.

Further, the photoelectric conversion element 152 can function as a light-blocking film in the case where one of the third electrode 152a, the p-type semiconductor layer 152b, the i-type semiconductor layer 152c, the n-type semiconductor layer 152d, and the fourth electrode 152e has a light-blocking function, or in the case where the layers are combined so as to have a light-blocking function.

Thus, the light-emitting element 120 and the photoelectric conversion element 152 are provided closely each other, so that materials which reflect or absorb light hardly exist between the light-emitting element 120 and the photoelectric conversion element 152. That is, all of the light other than the light entering the color filter 154 enters the photoelectric conversion element 152. This effect, as shown in this embodiment, can be obtained only when the organic EL element with a top-emission structure and the photoelectric conversion element having a light-blocking function are combined. As a result, light energy can be collected efficiently.

Note that there is no particular limitation on a space 160 between the first substrate 101 and the second substrate 151 as long as the space 160 has a light-transmitting property. It is preferable that the space 160 be filled with a transparent material the refractive index of which is higher than the air. In the case where the refractive index is low, light emitted from the light-emitting element 120 in an oblique direction is further refracted by the space 160, and light is emitted from an adjacent pixel in some cases. Thus, for example, the space 160 can be filled with a transparent adhesive having high refractive index and capable of bonding the first substrate 101 and the second substrate 151. Further, the space 160 can be filled with an inert gas or the like such as nitrogen, argon, or the like can be used.

Further, the first substrate 101 formed with the transistor 130 controlling driving of a light-emitting element and the light-emitting element 120 can be formed using a substrate that differs from the second substrate 151 formed with the photoelectric conversion element 152. That is, the photoelectric conversion element 152 can be formed directly on the second substrate 151 and there is no limitation by other materials or steps; thus, a simple manufacturing process can be performed. Therefore, the transistor 130 and the light-emitting element 120 can be formed over a substrate that differs from the substrate of the photoelectric conversion element 152. Accordingly, a low incidence of defects and high yield can be realized.

Next, a detailed description of the light-emitting device shown in FIGS. 1A to 1C and a manufacturing method thereof will be described.

First, a manufacturing method of the first substrate 101 provided with the transistor 130 controlling driving of a light-emitting element and the light-emitting element 120 will be described below.

<Manufacturing Method of First Substrate>

A conductive layer is formed over the first substrate 101 having an insulating surface, and then, a photolithography step is performed so that a resist mask is formed. An unnecessary portion of the conductive layer is removed by etching, so that a gate electrode 102 is formed. Etching is preferably performed so that end portions of the gate electrode 102 have tapered shapes as shown in FIG. 1A, because coverage with a film stacked thereover is improved.

Note that there is no particular limitation on a substrate which can be used as the first substrate 101; however, it needs to have at least heat resistance to withstand later heat treatment. A glass substrate can be used as the first substrate 101.

As the glass substrate, in the case where the temperature of the heat treatment performed later is high, a substrate having a strain point of 730° C. or higher is preferably used. As a glass substrate, a glass material such as aluminosilicate glass, aluminoborosilicate glass, barium borosilicate glass, or the like is used, for example. Note that when containing a larger amount of barium oxide (BaO) than that of boron oxide, a glass substrate is heat-resistant and of more practical use. Therefore, a glass substrate containing a larger amount of BaO than that of $B_2O_3$ is preferably used.

Note that instead of the above glass substrate, a substrate formed using an insulator such as a ceramic substrate, a quartz substrate, a sapphire substrate, or the like may be used. Alternatively, crystallized glass or the like can be used. A light-emitting device in this embodiment has a top-emission structure in which light is extracted through the second substrate 151; therefore, a non-light-transmitting substrate such as a metal substrate or the like can be used as the first substrate 101.

An insulating film serving as a base film may be provided between the first substrate 101 and the gate electrode 102. The base film has a function of preventing diffusion of an impurity element from the first substrate 101, and can be formed to have a single-layer or stacked-layer structure using one or more of a silicon nitride film, a silicon oxide film, a silicon nitride oxide film, and a silicon oxynitride film.

The gate electrode 102 can be formed to have a single-layer or stacked-layer structure using a metal material such as molybdenum, titanium, chromium, tantalum, tungsten, aluminum, copper, neodymium, scandium, or the like, or an alloy material which contains any of these materials as its main component.

Next, a gate insulating layer 104 is formed over the gate electrode 102. The gate insulating layer 104 can be formed to have a single-layer or stacked-layer structure using a silicon oxide film, a silicon nitride film, a silicon oxynitride film, a silicon nitride oxide film, or an aluminum oxide film by a plasma CVD method, a sputtering method, or the like. For example, a silicon oxynitride film may be formed using a deposition gas containing $SiH_4$, oxygen, and nitrogen by a plasma CVD method.

Next, a semiconductor layer is formed, and a photolithography step and an etching step are performed thereon, so that an island-shape semiconductor layer 106 is formed.

The semiconductor layer 106 can be formed using a silicon semiconductor or an oxide semiconductor. As a silicon semiconductor, single crystal silicon, polycrystalline silicon, or the like can be used as appropriate. As an oxide semiconductor, an In—Ga—Zn—O-based metal oxide or the like can be used as appropriate. Note that as the semiconductor layer 106, an oxide semiconductor which is an In—Ga—Zn—O-based metal oxide is preferably used so that the semiconductor layer have low off-state current, because an off state leakage current of a light-emitting element to be formed later can be reduced.

Next, a conductive film is formed over the gate insulating layer 104 and the semiconductor layer 106, and a source and drain electrodes 108 are formed by a photolithography step and an etching step.

As the conductive film for forming the source and drain electrodes 108, for example, a metal film containing an element selected from Al, Cr, Cu, Ta, Ti, Mo, and W, a metal nitride film (a titanium nitride film, a molybdenum nitride film, or a tungsten nitride film) containing any of the above-described elements as its component, or the like can be used.

Alternatively, the conductive film may have a structure in which a refractory metal film such as a Ti film, a Mo film, a W film, or the like, or a metal nitride film thereof (a titanium nitride film, a molybdenum nitride film, or a tungsten nitride film) is stacked on one or both of a bottom side and a top side of a metal film such as an Al film, a Cu film, or the like. Alternatively, the conductive film for forming the source and drain electrodes 108 may be formed using conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO), indium oxide-zinc oxide alloy ($In_2O_3$—ZnO), or any of these metal oxide materials containing silicon oxide can be used.

Next, an insulating layer 110 is formed over the semiconductor layer 106 and the source and drain electrodes 108. As the insulating layer 110, an inorganic insulating film such as a silicon oxide film, a silicon oxynitride film, and the like can be used.

Next, a second insulating layer 112 is formed over the insulating layer 110.

As the second insulating layer 112, an insulating film with a planarization function is preferably selected in order to reduce surface unevenness due to the transistor. For example, an organic material such as polyimide, acrylic, benzocyclobutene, or the like can be used. Other than such organic materials, a low-dielectric constant material (a low-k material), or the like can also be used. Note that the second insulating layer 112 may be formed by stacking a plurality of insulating films formed using any of these materials.

Next, by a photolithography step and an etching step, an opening which reaches the source and drain electrodes 108 is formed in the second insulating layer 112 and the insulating layer 110. As a method for forming the opening, a dry etching method, a wet etching method, or the like may be selected as appropriate.

Next, a conductive film is formed over the second insulating layer 112 and the source and drain electrodes 108, and then, a first electrode 114 is formed by a photolithography step and an etching step.

As the first electrode 114, a material which reflects light emitted from an organic EL layer 118 (to be formed later) efficiently is preferable. This is because the light-extraction efficiency can be improved. Note, that the first electrode 114 may have a stacked-layer structure. For example, a conductive film of metal oxide, a titanium film, or the like is formed thin on the side which is in contact with the organic EL layer 118 including a light-emitting substance, and a metal film (aluminum, an alloy of aluminum, silver, or the like) which has high reflectance can be used on the other side. With such a structure, the formation of an insulating film between the organic EL layer 118 and a metal film (aluminum, an alloy of aluminum, silver, or the like) which has high reflectance can be suppressed, which is preferable.

Next, a partition 116 is formed over the first electrode 114.

For the partition 116, an organic insulating material or an inorganic insulating material is used. It is particularly preferable that the partition 116 be formed using a photosensitive resin material to have an opening over the first electrode 114 and a sidewall inclined with continuous curvature.

Next, the organic EL layer 118 is formed over the first electrode 114 and the partition 116. The organic EL layer 118 may have a single-layer or stacked-layer structure, light emitted from the organic EL layer 118 is preferably white, and light having a peak in each of red, green, and blue wavelength regions is preferable.

Next, a second electrode 119 is formed over the organic EL layer 118.

Note that one of the first electrode 114 and the second electrode 119 functions as an anode of the light-emitting element 120, and the other functions as a cathode of the light-emitting element 120. It is preferable to use a substance having a high work function for the electrode which functions as an anode, and a substance having a low work function for the electrode which functions as a cathode.

Note that in this embodiment, the light-emitting element 120 includes the first electrode 114, the organic EL layer 118, and the second electrode 119.

By the above steps, the first substrate 101 provided with the transistor 130 controlling driving of a light-emitting element and the light-emitting element 120 is formed.

Next, a manufacturing method of the second substrate 151 provided with the photoelectric conversion element 152 and the color filter 154 will be described with reference to FIGS. 2A and 2B.

<Manufacturing Method of Second Substrate>

Figure 2A:
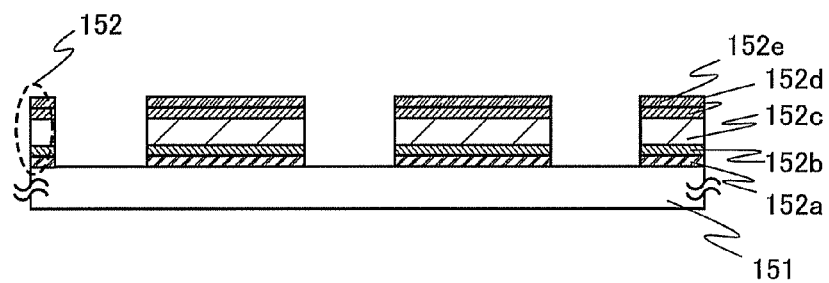
FIGS. 2A and 2B are diagrams illustrating a manufacturing method of a light-emitting device.

First, a conductive film is formed over the second substrate 151, and then, a third electrode 152a is formed by a photolithography step and an etching step (see FIG. 2A).

As the third electrode 152a, metal such as aluminum, silver, or the like, which has high reflectance, can be used. Note that the above metal relatively easily reacts with the p-type semiconductor layer or the like including silicon component, which is to be formed later to be alloyed. For the purpose of preventing the above metal from being alloyed, metal such as chromium, nickel, titanium, or the like, or metal oxide such as zinc oxide or the like may be formed thin as a barrier metal over the metal which has high reflectance. Further, it is preferable to have a three-layer structure in which metal such as chromium, nickel, titanium, or the like is formed under the metal which has high reflectance in order to improve adhesion to the second substrate 151 and reduce reflection of outside light.

A base film may be formed between the second substrate 151 and the third electrode 152a. The base film has a function of preventing diffusion of an impurity element from the substrate 151, and can be formed to have a single-layer or stacked-layer structure using one or more of a silicon nitride film, a silicon oxide film, a silicon nitride oxide film, and a silicon oxynitride film.

Further, a resin layer or the like including pigment may be formed between the second substrate 151 and the third electrode 152a for preventing reflection of outside light.

Next, the p-type semiconductor layer 152b, the i-type semiconductor layer 152c, and the n-type semiconductor layer 152d are formed to be stacked in this order over the third electrode 152a.

The p-type semiconductor layer 152b, the i-type semiconductor layer 152c, and the n-type semiconductor layer 152d can be formed using an amorphous semiconductor film, a polycrystalline semiconductor film, a microcrystalline semiconductor film, or the like by a sputtering method, an LPCVD method, a plasma CVD method, or the like. In the case of employing these manufacturing methods, it is preferable that the p-type semiconductor layer 152b, the i-type semiconductor layer 152c, and the n-type semiconductor layer 152d be successively formed without being exposed to the air so as to prevent dust or the like from being attached to their interfaces.

Alternatively, a single crystal semiconductor film formed by an SOI method may be used as the p-type semiconductor layer 152b, the i-type semiconductor layer 152c, or the n-type semiconductor layer 152d. In the case where the single crystal semiconductor film is used, the number of crystal defects which become a factor of inhibiting transport of carriers in a diode is small. Thus, photoelectric conversion efficiency of a photo diode can be raised. Note that, because the second substrate 151 needs to have a light-transmitting property, in the case where the single crystal semiconductor film fowled by an SOI method is used, the single crystal semiconductor film needs to be transferred to a transparent substrate. When the single crystal semiconductor film is transferred to the transparent substrate, a known technique may be used as appropriate.

Note that the single crystal semiconductor film formed by an SOI method may have a single-layer structure of the p-type semiconductor layer 152b, the i-type semiconductor layer (intrinsic semiconductor layer) 152c, or the n-type semiconductor layer 152d.

As a material of a semiconductor used for the p-type semiconductor layer 152b, the i-type semiconductor layer 152c, and the n-type semiconductor layer 152d, silicon, silicon carbide, germanium, silicon germanium, or the like can be used.

For example, the p-type semiconductor layer 152b, the i-type semiconductor layer 152c, and the n-type semiconductor layer 152d which are formed using amorphous silicon can be formed by glow discharge decomposition of a formation gas containing silicon such as silane, disilane, or the like.

Further, in the case where, for example, boron is used as an impurity element imparting p-type conductivity, the p-type semiconductor layer 152b can be fowled by adding boron, diborane, boron trifluoride, or the like to the formation gas. In the case where, for example, phosphorus is used as an impurity element imparting n-type conductivity, the n-type semiconductor layer 152d can be formed by adding phosphine, or the like to the formation gas.

Note that a semiconductor used for the i-type semiconductor layer 152c refers to a semiconductor which contains an impurity element imparting p-type or n-type conductivity at a concentration of $1\times10^{20}$ cm$^{-3}$ or lower and has photoconductivity 100 or more times as high as dark conductivity. The i-type semiconductor layer 152c also includes a semiconductor containing an impurity element which belongs to Group 13 or Group 15 of the periodic table in its category. That is, the i-type semiconductor layer 152c includes, in its category, a semiconductor which has weak n-type electric conductivity when an impurity element for controlling valence electrons is not added intentionally and to which an impurity element imparting p-type conductivity is added intentionally or unintentionally during or after film formation.

Further, the p-type semiconductor layer 152b, the i-type semiconductor layer 152c, and the n-type semiconductor layer 152d which are formed using amorphous silicon containing silicon carbide, can be formed by glow discharge decomposition of a formation gas containing carbon and silicon. Methane, ethane, or the like can be given as a gas containing carbon. Silane, disilane, or the like can be given as a gas containing silicon. The gas containing silicon diluted with hydrogen or with hydrogen and helium may be used.

Further, the p-type semiconductor layer 152b, the i-type semiconductor layer 152c, and the n-type semiconductor layer 152d which are foamed using a microcrystalline semiconductor containing silicon can be formed with a gas containing silicon diluted with hydrogen by a high-frequency plasma CVD method with a frequency of several tens of megahertz to several hundreds of megahertz or a microwave plasma CVD method with a frequency of 1 GHz or higher. Silicon hydride such as silane, disilane, or the like, silicon fluoride, or silicon chloride may be used as a gas containing silicon. Further, the gas containing silicon may be diluted with hydrogen and one or more kinds of rare gases selected from helium, argon, krypton, and neon.

Further, the p-type semiconductor layer 152b, the i-type semiconductor layer 152c, and the n-type semiconductor layer 152d which are formed using a polycrystalline semiconductor, can be formed by crystallization of an amorphous semiconductor layer or a microcrystalline semiconductor layer by a laser crystallization method, a thermal crystallization method, a thermal crystallization method in which a catalytic element such as nickel or the like which promotes crystallization is used, or the like alone, or by a combination of any of the above methods. Alternatively, a polycrystalline semiconductor may be formed directly by a sputtering method, a plasma CVD method, a thermal CVD method, or the like.

Note that in this embodiment, the case where a pin junction is formed by stacking the p-type semiconductor layer 152b, the i-type semiconductor layer 152c, and the n-type semiconductor layer 152d in this order is shown; however, the present invention is not limited to this structure. The n-type semiconductor layer 152d, the i-type semiconductor layer 152c, and the p-type semiconductor layer 152b may be stacked in this order.

Next, a photolithography step is performed so that a resist mask is formed. Then, an unnecessary portion of the p-type semiconductor layer 152b, the i-type semiconductor layer 152c, and the n-type semiconductor layer 152d is removed by etching. The etching of the p-type semiconductor layer 152b, the i-type semiconductor layer 152c, and the n-type semiconductor layer 152d can be performed by a dry etching method or a wet etching method.

In the case of the dry etching method, as the etching gas, a chloride gas such as chlorine, boron chloride, silicon chloride, carbon tetrachloride, or the like; a fluoride gas such as carbon tetrafluoride, sulfur fluoride, nitrogen fluoride, or the like; oxygen; or the like can be used as appropriate. For example, the dry etching may be performed by, for example, a reactive ion etching (RIB) method, an inductively coupled plasma (ICP) etching method, an electron cyclotron resonance (ECR) etching method, a parallel plate type (capacitive coupled type) etching method, a magnetron plasma etching method, a dual-frequency plasma etching method, a helicon wave plasma etching method, or the like.

Further, in the case of using wet etching, a solution of tetramethylarnmonium hydroxide (abbreviation: TMAH) can be used as an etchant.

Next, a conductive film is formed over the n-type semiconductor layer 152d, and then, the fourth electrode 152e is formed by a photolithography step and an etching step.

As the fourth electrode 152e, a conductive film which transmits visible light is used. For the conductive film which transmits visible light, for example, indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, indium tin oxide to which silicon oxide is added, or the like can be given. Further, a metal film having a thickness thin enough to transmit light (preferably, approximately 5 nm to 30 nm) can also be used. For example, an aluminum film having a thickness of 20 nm can be used as the fourth electrode 152e.

By the above steps, the photoelectric conversion element 152 can be formed. Note that in this embodiment, a photodiode including a pin junction is illustrated as the photoelectric conversion element 152; however, the photoelectric conversion element 152 is not limited thereto as long as the photoelectric conversion element 152 has a photoelectric conversion function.

Figure 2B:
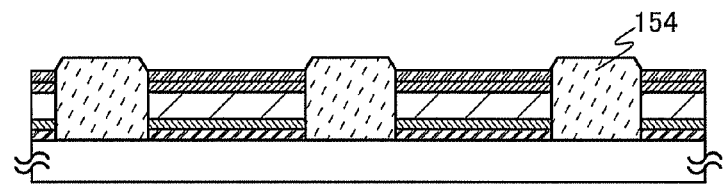

Next, the color filter 154 is faulted over the second substrate 151 and the photoelectric conversion element 152 (see FIG. 2B).

As the color filter 154, a red (R) color filter, a green (G) color filter, a blue (B) color filter, or the like can be used. Each color filter is formed in a desired position with a known material by a printing method, an inkjet method, an etching method using a photolithography technique, or the like.

Here, a method of using three colors of R, G, and B is described; however, the present invention is not limited thereto. A structure in which four colors of R, G, B, and Y (yellow) are used or a structure in which a single color selected from R, B, and Y is used is possible.

By the above steps, the second substrate 151 provided with the photoelectric conversion element 152 and the color filter 154 can be formed.

Note that in this embodiment, a method by which the color filter 154 is formed after the photoelectric conversion element 152 is formed is illustrated; however, the present invention is not limited thereto. The photoelectric conversion element 152 may be formed after the color filter 154 is formed. However, as in this embodiment, it is preferable that the color filter 154 be formed after the photoelectric conversion element 152 is formed. This is because the color filter 154 is formed of an organic resin or the like and in the case where the color filter 154 is formed before the photoelectric conversion element 152, the photoelectric conversion element 152 needs to be formed in consideration of the heat resistance of the organic resin or the like.

As in the present invention, by forming the photoelectric conversion element 152 having a light-blocking function over the second substrate 151 which is not provided with the transistor 130 controlling driving of a light-emitting element and the light-emitting element 120, there is no limitation by other materials or steps (for example, a limitation by high-temperature heat treatment or the like in a transistor formation step); thus, a simple manufacturing process can be performed.

Further, because the photoelectric conversion element 152 is formed over the second substrate 151, light from the organic EL layer 118 in the light-emitting element 120 provided over the first substrate 101 is absorbed by the photoelectric conversion element 152, and the light can be converted into electric power.

As described above, by converting light from a light-emitting device into electric power efficiently for reuse, a light energy reuse type light-emitting device with low power consumption can be realized.

Further, light entering a black matrix (BM) which is a light-blocking film is conventionally converted into heat (heat energy). A light-emitting element is heated when heat is generated, which causes a problem of reliability of the light-emitting element. However, in the disclosed present invention, light entering a photoelectric conversion element is converted into electric power. By that, generation of heat is suppressed. That is, heating of the light-emitting element is also suppressed, and at the same time, the improvement of reliability of the light-emitting device can be realized.

Further, the black matrix (BM) which is a light-blocking film is essential for a display device in order to divide pixels; however, as described above, the black matrix is conventionally also a heat source. An embodiment of the disclosed present invention is a system which collects inevitable waste energy which is generated in a display device in such a way.

Further, the substrate provided with the transistor and the light-emitting element is a substrate that differs from the substrate provided with the photoelectric conversion element; thus, an incidence of defects is low and yield is high. That is, a light energy reuse type light-emitting device with high yield can be realized.

Embodiment 1 can be implemented in appropriate combination with the structures described in the other embodiments.

(Embodiment 2)

In this embodiment, a display device which is one embodiment of a light-emitting device of the present invention will be described with reference to FIG. 3.

Figure 3:
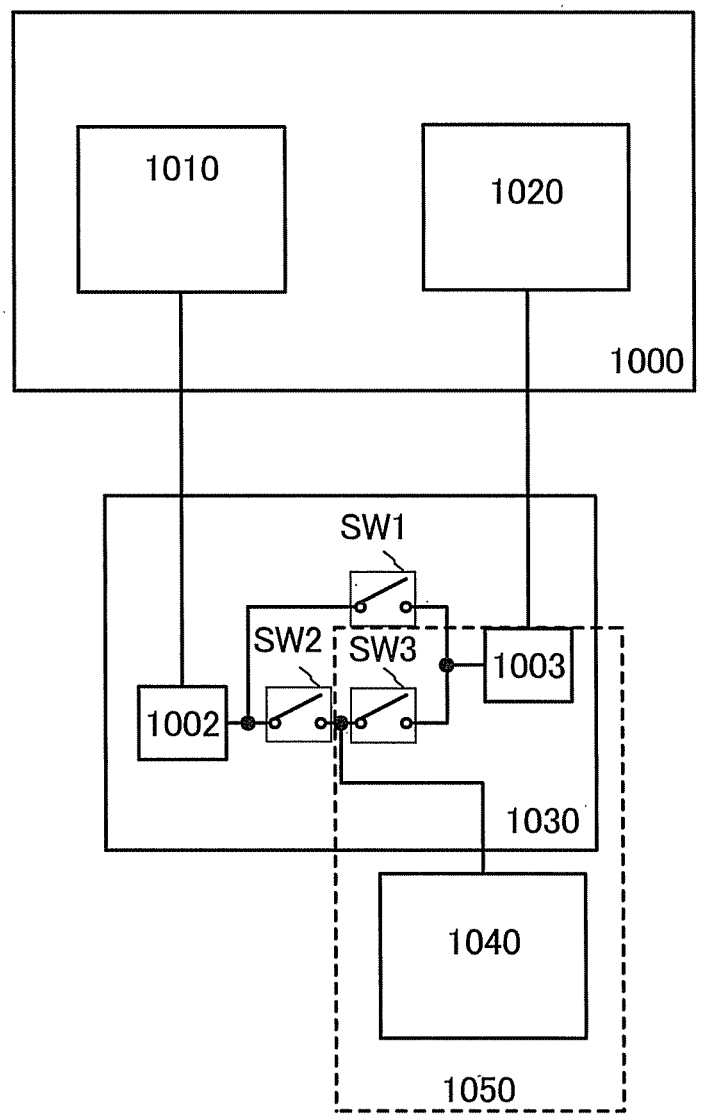
FIG. 3 is a block diagram illustrating a light-emitting device.

FIG. 3 illustrates a block diagram of a display device 1000, a peripheral circuit, and the like, in which a photoelectric conversion element 1010 having a light-blocking function, a display portion 1020, a power control circuit 1030, and a power storage portion 1040 are included. Note that the power control circuit 1030 having a structure including a converter 1002, a converter 1003, and switches SW1 to SW3 is illustrated. Further, a light-emission control circuit 1050 having a structure including the converter 1003, the switch SW3, and the power storage portion 1040 is illustrated. Note that the display portion 1020 has a structure including a light-emitting element and a transistor for driving the light-emitting element.

First, the operation of the display device in the case where light from the light-emitting element is absorbed by the photoelectric conversion element 1010, so that the light is converted into electric power, and electric power is generated will be described.

Electric power generated in the photoelectric conversion element 1010 is stepped up or down by the converter 1002 so as to be a voltage for charge of the power storage portion 1040. Then, when the electric power from the photoelectric conversion element 1010 is used for the operation of the display portion 1020, the switch SW1 is turned on and the voltage of the electric power is stepped up or down by the converter 1003 so as to be a voltage needed for the display portion 1020. In addition, when display on the display portion 1020 is not performed, the switch SW1 is turned off and the switch SW2 is turned on so that charge of the power storage portion 1040 may be performed.

Further, in the case where electric power needed for the display portion 1020 cannot be obtained from the photoelectric conversion element 1010 alone, the switch SW1 and the switch SW3 may be turned on so that the electric power from the photoelectric conversion element 1010 and the electric power from the power storage portion 1040 can be used together.

Next, the operation of the display device in the case where electric power is not generated by the photoelectric conversion element 1010, that is, in the case where the light-emitting element does not emit light will be described.

Because electric power from the photoelectric conversion element 1010 is not provided, the light-emission control circuit 1050 operates so that electric power which is already stored in the power storage portion 1040 is used. That is, by turning on the switch SW3, the electric power stored in the power storage portion 1040 is stepped up or down by the converter 1003. Then, electric power from the power storage portion 1040 is used for operation of the display portion 1020.

Note that there is no particular limitation on the power storage portion 1040; however, it is preferable that a lithium ion battery is used because there is an advantage of downsizing or the like.

As described above, by converting light from a display device which is one embodiment of a light-emitting device into electric power efficiently for reuse, a light energy reuse type light-emitting device with low power consumption can be realized. Further, light from a light-emitting element is converted into electric power, so that a power storage portion can be charged.

Embodiment 2 can be implemented in appropriate combination with the structures described in the other embodiments.

(Embodiment 3)

In this embodiment, details of the light-emitting element 120 including the first electrode 114, the organic EL layer 118, and the second electrode 119 which are described in Embodiment 1 will be described with reference to FIGS. 4A and 4B.

<Structure of Light-emitting Element>

Figure 4A:
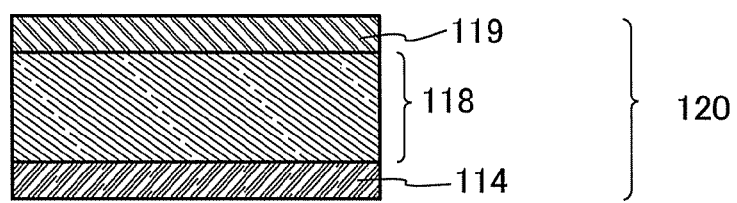
FIGS. 4A and 4B are diagrams each illustrating an example of a light-emitting element.

The light-emitting element 120 shown in FIG. 4A has a structure in which the organic EL layer 118 including a light-emitting region is sandwiched between a pair of electrodes (the first electrode 114 and the second electrode 119). Note that the first electrode 114 is used as an anode and the second electrode 119 is used as a cathode as an example in the following description of this embodiment.

The organic EL layer 118 includes at least a light-emitting layer, and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, an electron-injection layer, and the like can be used in appropriate combination.

The light-emitting element 120 shown in FIG. 4A emits light when current flows because of a potential difference generated between the first electrode 114 and the second electrode 119, and holes and electrons are recombined in the organic EL layer 118. That is, the light-emitting element 120 has a structure in which the light-emitting region is formed in the organic EL layer 118.

In the present invention, light is extracted from the second electrode 119 side to outside. Thus, the second electrode 119 is formed using a substance having a light-transmitting property. Further, in order to extract light from the second electrode 119 side to outside efficiently, the first electrode 114 is preferably formed using a substance which has high reflectance.

Figure 4B:
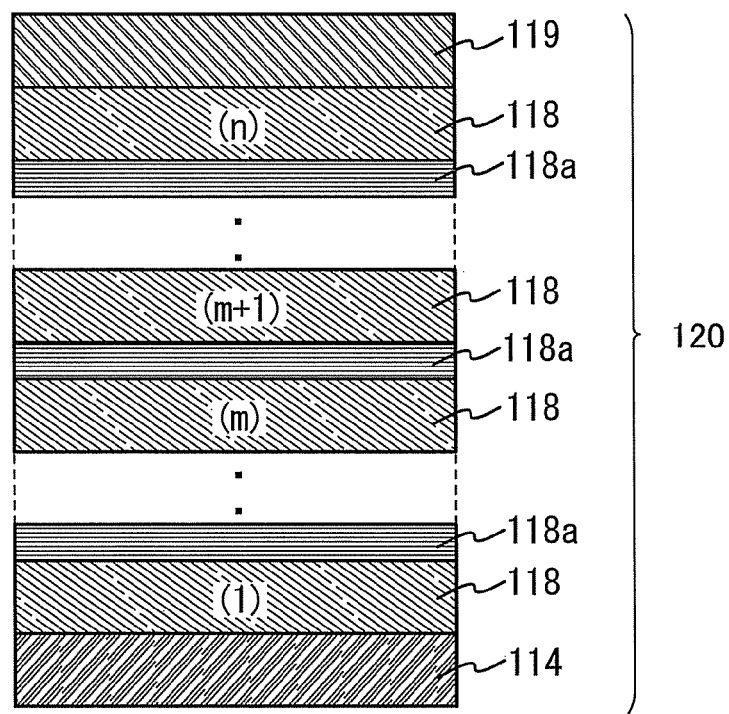

Note that a plurality of organic EL layers 118 may be stacked between the first electrode 114 and the second electrode 119 as shown in FIG. 4B. In the case where n (n is a natural number of 2 or more) layers are stacked, a charge generation layer 118a is preferably provided between m-th (m is a natural number of 1 to n−1) organic EL layer and (m+1)-th organic EL layer.

The charge generation layer 118a may be formed using a composite material of an organic compound and a metal oxide, a metal oxide, a composite material of an organic compound and an alkali metal, an alkaline earth metal, or a compound thereof; alternatively, these materials can be combined as appropriate. As the composite material of an organic compound and a metal oxide, for example, a composite material of an organic compound and a metal oxide such as $V_2O_5$, $MoO_3$, $WO_3$, or the like is included. As the organic compound, various compounds such as an aromatic amine compound, a carbazole derivative, aromatic hydrocarbon, a high molecular compound (oligomer, dendrimer, polymer, or the like), and the like can be used. Note that as the organic compound, it is preferable to use an organic compound which has a hole-transport property and has a hole mobility of $10^{-6}$ $cm^2/Vs$ or higher. However, a substance other than these materials may also be used as long as a hole-transport property thereof is higher than an electron-transport property thereof. These materials used for the charge generation layer 118a are excellent in a carrier-injection property and a carrier-transport property; thus, the light-emitting element 120 can be driven with low current and with low voltage.

Note that the charge generation layer 118a may be formed by combining the composite material of an organic compound and a metal oxide with another material. For example, a layer containing the composite material of an organic compound and a metal oxide may be combined with a layer containing the compound of a substance selected from substances with an electron-donating property and a compound with a high electron-transport property. Further, a layer containing the composite material of an organic compound and a metal oxide may be combined with a transparent conductive film.

As for the light-emitting element 120 having such a structure, problems such as energy transfer, quenching, and the like are unlikely to occur, and a light-emitting element which has both high light emission efficiency and long lifetime is easily obtained due to expansion in the choice of materials. Further, a light-emitting element which provides phosphorescence from one of light-emitting layers and fluorescence from the other of the light-emitting layers can be easily obtained.

Note that the charge generation layer 118a has a function of injecting holes to one of the organic EL layers 118, which is formed in contact with the charge generation layer 118a, and a function of injecting electrons to the other of the organic EL layers 118, when a voltage is applied between the first electrode 114 and the second electrode 119.

The light-emitting element 120 shown in FIG. 4B can provide a variety of emission colors by changing the type of the light-emitting substance which is used for the organic EL layer. In addition, a plurality of light-emitting substances of different colors is used as the light-emitting substance, whereby light emission having a broad spectrum or white light emission can also be obtained.

In the case of obtaining white light emission using the light-emitting element 120 shown in FIG. 4B, as for the combination of a plurality of organic EL layers, a structure for emitting white light including red light, blue light, and green light may be used. For example, the structure may include a first organic EL layer containing a blue fluorescent substance as a light-emitting substance and a second organic EL layer containing green and red phosphorescent substances as light-emitting substances. Alternatively, the structure may include a first organic EL layer exhibiting red light emission, a second organic EL layer exhibiting green light emission, and a third organic EL layer exhibiting blue light emission. Also with a structure including organic EL layers emitting light of complementary colors, white light emission can be obtained. When light emitted from the first organic EL layer and light emitted from the second organic EL layer have complementary colors to each other in a stacked-layer element including two organic EL layers stacked, the combination of colors are as follows: blue and yellow, blue green and red, and the like.

Note that in the structure of the above-described stacked-layer element, by providing the charge generation layer between the stacked organic EL layers, the element can have long lifetime in a high-luminance region while keeping the current density low. In addition, the voltage drop due to resistance of the electrode material can be reduced, whereby uniform light emission in a large area is possible.

Further, the light-emitting element 120 described in this embodiment can be a light-emitting element having high emission efficiency by employing a top-emission structure.

(Embodiment 4)

Figure 5A:
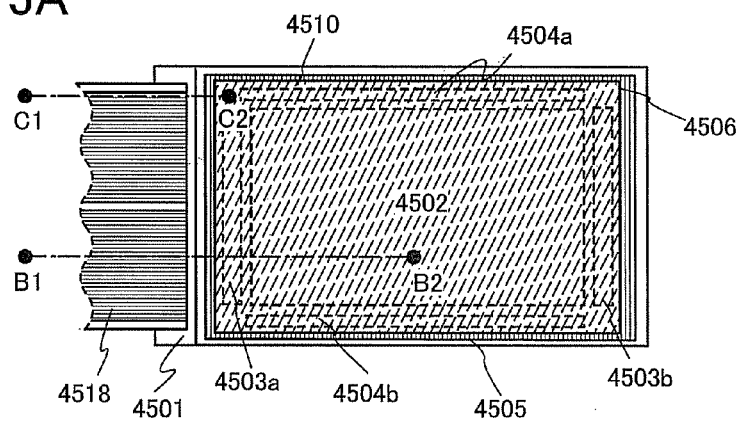
FIGS. 5A to 5C are diagrams each illustrating a light-emitting device.
Figure 5B:
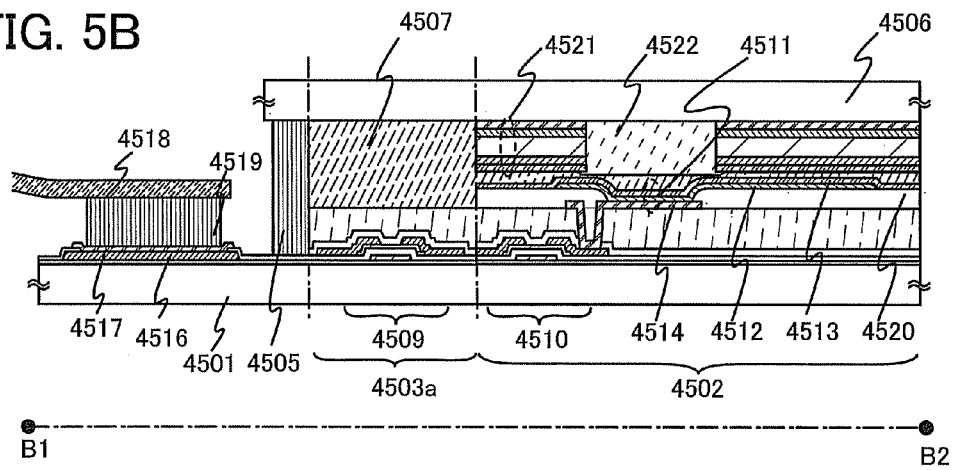
Figure 5C:
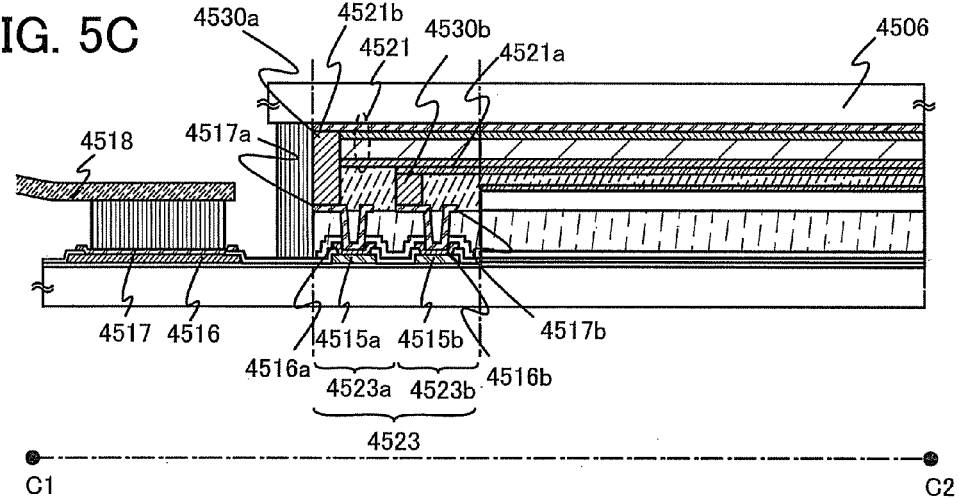

In this embodiment, an appearance and a cross section of a display device (also referred to as a display panel or a light-emitting panel) which is one embodiment of a light-emitting device will be described with reference to FIGS. 5A to 5C. FIG. 5A is a plan view of a panel in which a transistor for driving a light-emitting element and a light-emitting element provided over a first substrate, and a photoelectric conversion element having a light-blocking function and a color filter provided on a second substrate, are sealed with a sealant. FIG. 5B corresponds to a cross-sectional view taken along line B1-B2 in FIG. 5A. Further, FIG. 5C corresponds to a cross-sectional view taken along line C1-C2 in FIG. 5A.

A sealant 4505 is provided to surround a pixel portion 4502, a signal line driver circuit 4503*a*, a signal line driver circuit 4503*b*, a scan line driver circuit 4504*a*, and a scan line driver circuit 4504*b* which are provided over a first substrate 4501. Further, a second substrate 4506 is provided over the pixel portion 4502, the signal line driver circuit 4503*a*, the signal line driver circuit 4503*b*, the scan line driver circuit 4504*a*, and the scan line driver circuit 4504*b*.

Note that the second substrate 4506 is provided with a photoelectric conversion element 4521 and a color filter 4522. The photoelectric conversion element 4521 and the color filter 4522 can be formed by a method similar to that for the photoelectric conversion element 152 and the color filter 154 described in Embodiment 1.

With such a structure, the pixel portion 4502, the signal line driver circuit 4503*a*, the signal line driver circuit 4503*b*, the scan line driver circuit 4504*a*, and the scan line driver circuit 4504*b* are hermetically sealed together with a filler 4507 by the first substrate 4501, the sealant 4505, and the second substrate 4506. It is preferable that a panel be packaged (sealed) with a protective film (an attachment film, an ultraviolet curable resin film, or the like) or a cover material with little degasification so that the panel is not exposed to the outside air, which is because the air-tightness becomes high.

Further, the pixel portion 4502, the signal line driver circuit 4503*a*, the signal line driver circuit 4503*b*, the scan line driver circuit 4504*a*, and the scan line driver circuit 4504*b* which are provided over the first substrate 4501 each include a plurality of thin film transistors, and a thin film transistor 4510 included in the pixel portion 4502 and a thin film transistor 4509 included in the signal line driver circuit 4503*a* are shown in FIG. 5B.

The transistor 4509 and the transistor 4510 can be formed by a method similar to that for the transistor 130 described in Embodiment 1.

Further, a first electrode 4514 included in a light-emitting element 4511 is electrically connected to the source electrode or the drain electrode of the transistor 4510. Note that the light-emitting element 4511 has a stacked structure of the first electrode 4514, an organic EL layer 4512, and a second electrode 4513. The element structure described in Embodiment 3 can be applied to the structure of the light-emitting element 4511.

A partition 4520 is formed using an organic resin film, an inorganic insulating film, or organic polysiloxane. It is particularly preferable that the partition 4520 be formed using a photosensitive material to have an opening over the first electrode 4514 and a sidewall inclined with continuous curvature.

The organic EL layer 4512 may have a single-layer or stacked-layer structure.

A protective film may be formed over the second electrode 4513 and the partition 4520 in order to prevent entry of oxygen, hydrogen, moisture, carbon dioxide, or the like into the light-emitting element 4511. As the protective film, a silicon nitride film, a silicon nitride oxide film, or the like can be used.

In addition, a variety of signals and potentials are supplied from an FPC 4518 to the signal line driver circuit 4503*a*, the signal line driver circuit 4503*b*, the scan line driver circuit 4504*a*, the scan line driver circuit 4504*b*, or the pixel portion 4502.

A connecting terminal electrode 4517 is formed using the same conductive film as the first electrode 4514 of the light-emitting element 4511. A terminal electrode 4516 is formed using the same conductive film as source electrodes and drain electrodes of the transistor 4509 and the transistor 4510.

The connecting terminal electrode 4517 is electrically connected to a terminal included in the FPC 4518 through an anisotropic conductive film 4519.

Light from the light-emitting element 4511 is emitted from the second substrate 4506 side. Therefore, the second substrate 4506 needs to have a light-transmitting property. For example, a material such as a glass plate, a plastic plate; a polyester film, an acrylic film, or the like is used for the second substrate 4506.

As the filler 4507, an ultraviolet curable resin or a thermosetting resin can be used other than an inert gas such as nitrogen, argon, or the like. Polyvinyl chloride (PVC), acrylic, polyimide, an epoxy resin, a silicone resin, polyvinyl butyral (PVB), or ethylene vinyl acetate (EVA) can be used. For example, nitrogen may be used for the filler.

If necessary, an optical film such as a polarizing plate, a circularly polarizing plate (including an elliptically polarizing plate), a retardation plate (a quarter-wave plate or a half-wave plate), or the like may be appropriately provided for the second substrate 4506. Further, the polarizing plate or the circularly polarizing plate may be provided with an anti-reflection film. For example, anti-glare treatment by which reflected light is diffused by projections and depressions on the surface so as to reduce the glare can be performed.

As the signal line driver circuit 4503*a*, the signal line driver circuit 4503*b*, the scan line driver circuit 4504*a*, and the scan line driver circuit 4504*b*, driver circuits formed by using a single crystal semiconductor film or a polycrystalline semiconductor film over a substrate separately prepared may be mounted. Alternatively, only the signal line driver circuits or part thereof, or only the scan line driver circuits or part thereof may be separately formed and mounted. This embodiment is not limited to the structure of FIGS. 5A to 5C.

Next, a light-emitting device shown in FIG. 5C will be described. In FIG. 5C, the photoelectric conversion element 4521 and a connecting terminal portion 4523 are electrically connected to each other through a terminal included in the FPC 4518, a conductive layer 4530*a*, and a conductive layer 4530*b*.

The conductive layer 4530*a* and the conductive layer 4530*b* should have conductivity. The conductive layer 4530*a* and the conductive layer 4530*b* may be connected to the connecting terminal portion 4523 with a conductive adhesive such as a silver paste, a copper paste, a carbon paste, or the like or a resin containing a conductive bead, or by solder joint, or the like.

Note that a third electrode 4521*a* included in the photoelectric conversion element 4521 is electrically connected to a connecting terminal portion 4523*b*. The third electrode 4521*a* is electrically connected to an electrode 4515*b* through a connecting terminal electrode 4517*b* formed using the same conductive film as the first electrode 4514 included in the light-emitting element 4511 and a terminal electrode 4516*b* formed using the same conductive film as the source and drain electrodes of the transistor 4510.

Further, a fourth electrode 4521*b* included in the photoelectric conversion element 4521 is electrically connected to a connecting terminal portion 4523*a*. The fourth electrode 4521*b* is electrically connected to an electrode 4515*a* through a connecting terminal electrode 4517*a* formed using the same conductive film as the first electrode 4514 included in the light-emitting element 4511 and a terminal electrode 4516*a* formed using the same conductive film as the source and drain electrodes of the transistor 4510.

Note that in this embodiment, a structure in which electric power from the photoelectric conversion element 4521 is extracted from the FPC 4518 is illustrated; however, the present invention is not limited thereto. As long as the third electrode 4521*a* and the fourth electrode 4521*b* are each connected to an electrode so that electric power is extracted, a power storage portion may be additionally provided outside the light-emitting device. Thus, this embodiment is not limited to the structure of FIGS. 5A to 5C.

As described above, by converting light from a display device which is one embodiment of a light-emitting device into electric power efficiently for reuse, a light energy reuse type light-emitting device with low power consumption can be realized. Further, because a photoelectric conversion element is provided closely to an organic EL layer which is one of the light-emitting elements, light from the organic EL layer can be absorbed efficiently by the photoelectric conversion element.

Embodiment 4 can be implemented in appropriate combination with the structures described in the other embodiments.

(Embodiment 5)

Figure 6A:
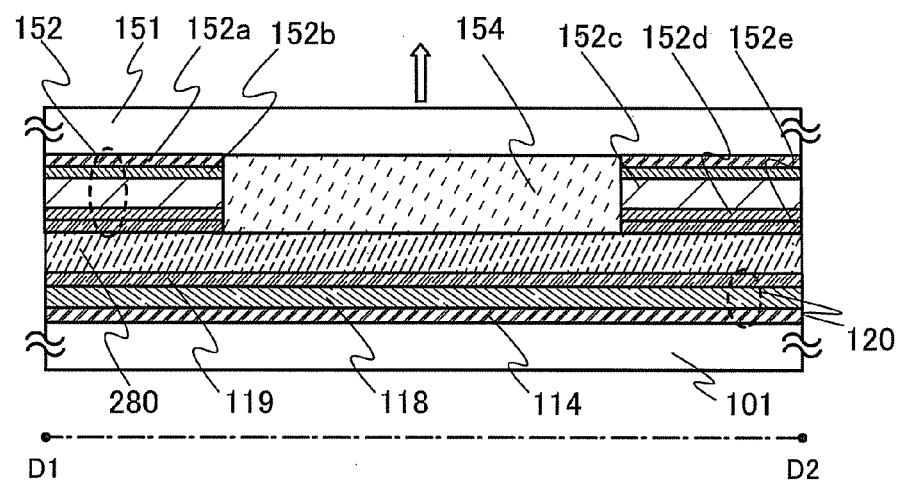
FIGS. 6A and 6B are diagrams each illustrating a light-emitting device.
Figure 6B:
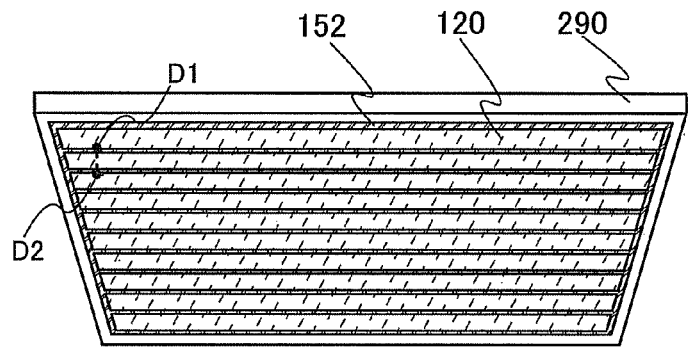

In this embodiment, an appearance and a cross section of a light-emitting device will be described with reference to FIGS. 6A and 6B. FIG. 6A is a cross-sectional view of a light-emitting device in which a light-emitting element including an organic EL layer provided over a first substrate, and a photoelectric conversion element having a light-blocking function and a color filter provided on a second substrate are sealed with a filler. FIG. 6B is a perspective view of the light-emitting device. Note that FIG. 6A corresponds to a cross-sectional view taken along line D1-D2 in FIG. 6B.

In this embodiment, the light-emitting device has a structure in which a transistor is not formed over the first substrate. That is, the light-emitting element includes a first electrode, an organic EL layer, and a second electrode over the first substrate.

The details of the light-emitting device shown in FIG. 6A will be described below.

The light-emitting device shown in FIGS. 6A and 6B is supplied with electric power from an external power source (not shown), whereby the light-emitting element 120 emits light; thus, the light-emitting device shown in FIGS. 6A and 6B can be used as a lighting device. Note that in this embodiment, a so-called striped structure in which photoelectric conversion elements 152 are linearly-arranged is illustrated; however, the present invention is not limited thereto. For example, the photoelectric conversion element 152 is formed to have a shape by a combination of a straight line or a curved line so that a non-light-emitting area of the lighting device can have a shape. With such a structure, the lighting device can have features like a picture.

As shown in FIG. 6A, the light-emitting element 120 including the first electrode 114, the organic EL layer 118, and the second electrode 119 is formed over the first substrate 101, and the photoelectric conversion element 152 including the third electrode 152*a*, the p-type semiconductor layer 152*b*, the i-type semiconductor layer 152*c*, the n-type semiconductor layer 152*d*, and the fourth electrode 152*e* is aimed on the second substrate 151. Further, the first substrate 101 and the second substrate 151 are hermetically sealed with a filler 280.

The light-emitting device shown in FIG. 6A has a top-emission structure in which light is emitted in a direction indicated by an arrow in FIG. 6A. Light of the organic EL layer 118 is absorbed and transmitted by the color filter 154, or is absorbed by the photoelectric conversion element 152.

As the filler 280, an ultraviolet curable resin or a thermosetting resin can be used other than an inert gas such as nitrogen, argon, or the like. For example, polyvinyl chloride (PVC), acrylic, polyimide, an epoxy resin, a silicone resin, polyvinyl butyral (PVB), or ethylene vinyl acetate (EVA) can be used. For example, nitrogen may be used for the filler.

Thus, the light-emitting element 120 and the photoelectric conversion element 152 are provided closely each other, so that materials which reflect or absorb light hardly exist between the light-emitting element 120 and the photoelectric conversion element 152. That is, all of the light other than the light entering the color filter 154 enters the photoelectric conversion element 152.

A housing 290 shown in FIG. 6B can store the light-emitting device shown in FIG. 6A, and can be used as a lighting device.

As described above, by converting light form a light-emitting device into electric power efficiently for reuse, a light energy reuse type light-emitting device with low power consumption can be realized.

Further, the present invention can be applied to a lighting device as one of the light-emitting devices, and a light energy reuse type light-emitting device with low power consumption can be realized.

Embodiment 5 can be implemented in appropriate combination with the structures described in the other embodiments.

(Embodiment 6)

In this embodiment, an electronic device including the light-emitting device described in Embodiment 1, Embodiment 2, or Embodiment 4 will be described.

Examples of the electronic device including the light-emitting device described in Embodiment 1, Embodiment 2, or Embodiment 4 include cameras such as video cameras, digital video cameras, or the like, goggle type displays, navigation systems, audio playback devices (e.g., car audio systems and audio systems), computers, game machines, portable information terminals (e.g., mobile computers, cellular phones, portable game machines, and electronic books), image playback devices in which a recording medium is provided (specifically, devices that are capable of playing back recording media such as digital versatile discs (DVDs) or the like and equipped with a display unit that can display images), and the like. Specific examples of these electronic appliances are shown in FIGS. 7A to 7D.

Figure 7A:
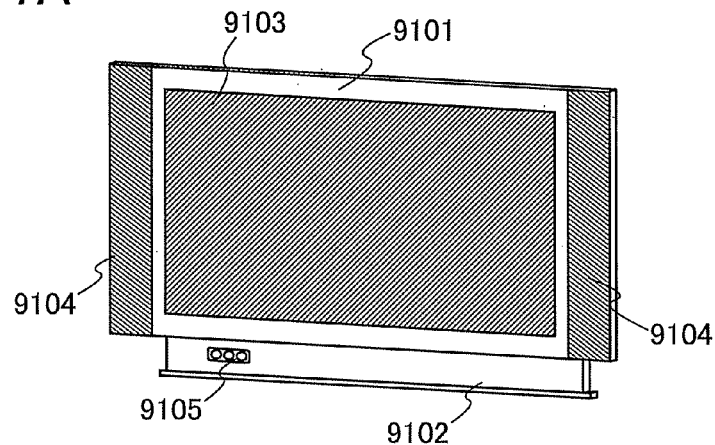
FIGS. 7A to 7D are diagrams each illustrating an electronic device using a lighting device.

FIG. 7A illustrates a television device which includes a housing 9101, a supporting base 9102, a display portion 9103, speaker portions 9104, video input terminals 9105, and the like. In this television device, the display portion 9103 is manufactured using the light-emitting device described in Embodiment 1, Embodiment 2, or Embodiment 4. A television device including a light energy reuse type light-emitting device can reuse light of the display portion 9103; thus, a television device with low power consumption can be provided.

Figure 7B:
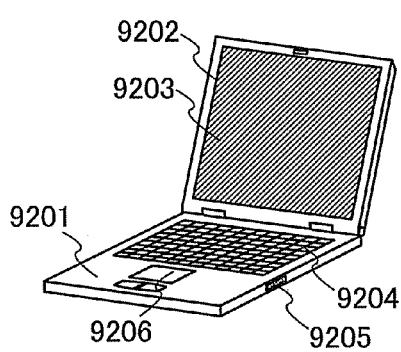

FIG. 7B illustrates a computer which includes a main body 9201, a housing 9202, a display portion 9203, a keyboard 9204, an external connection port 9205, a pointing device 9206, and the like. In this computer, the display portion 9203 is manufactured using the light-emitting device described in Embodiment 1, Embodiment 2, or Embodiment 4. A computer including a light energy reuse type light-emitting device can reuse light of the display portion 9203; thus, a computer with low power consumption can be provided. Further, in the case where the computer is portable, the power consumption thereof is low; thus, the computer can be used for a long time.

Figure 7C:
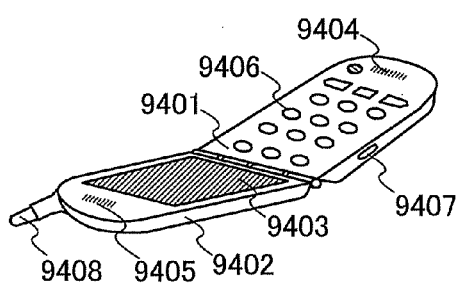

FIG. 7C illustrates a cellular phone which includes a main body 9401, a housing 9402, a display portion 9403, an audio input portion 9404, an audio output portion 9405, operation keys 9406, an external connection port 9407, an antenna 9408, and the like. In the cellular phone, the display portion 9403 is manufactured using the light-emitting device described in Embodiment 1, Embodiment 2, or Embodiment 4. A cellular phone including a light energy reuse type light-emitting device can reuse light of the display portion 9403; thus, a cellular phone with low power consumption can be provided. Further, because the power consumption thereof is low, the cellular phone can be used for a long time.

Figure 7D:
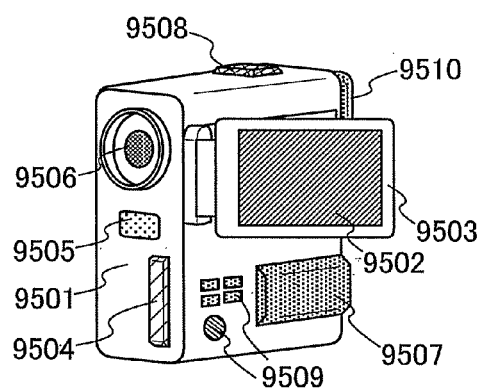

FIG. 7D shows a digital video camera which includes a main body 9501, a display portion 9502, a housing 9503, an external connection port 9504, a remote control receiving portion 9505, an image receiving portion 9506, a battery 9507, audio input portion 9508, operation keys 9509, an eyepiece portion 9510, and the like. In the digital video camera, the display portion 9502 is manufactured using the light-emitting device described in Embodiment 1, Embodiment 2, or Embodiment 4. A digital video camera including a light energy reuse type light-emitting device can reuse light of the display portion 9502; thus, a digital video camera with low power consumption can be provided.

As described above, the application range of the light-emitting device described in Embodiment 1, Embodiment 2, or Embodiment 4 is so wide that the light-emitting device can be applied to electronic devices of various fields.

Embodiment 6 can be implemented in appropriate combination with the structures described in the other embodiments.

(Embodiment 7)

In this embodiment, the light emitting device described in Embodiment 5 will be described.

Figure 8A:
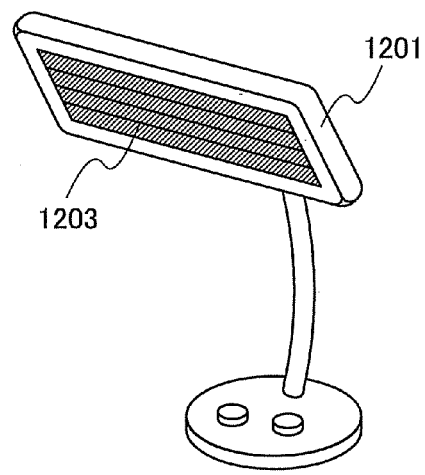
FIGS. 8A and 8B are diagrams each illustrating a light-emitting device using a lighting device.

FIG. 8A illustrates an example in which the light-emitting device of an embodiment of the present invention is used for a desk lamp. The desk lamp includes a housing 1201 and a lighting portion 1203. The lighting device of an embodiment of the present invention is used as the lighting portion 1203.

Figure 8B:
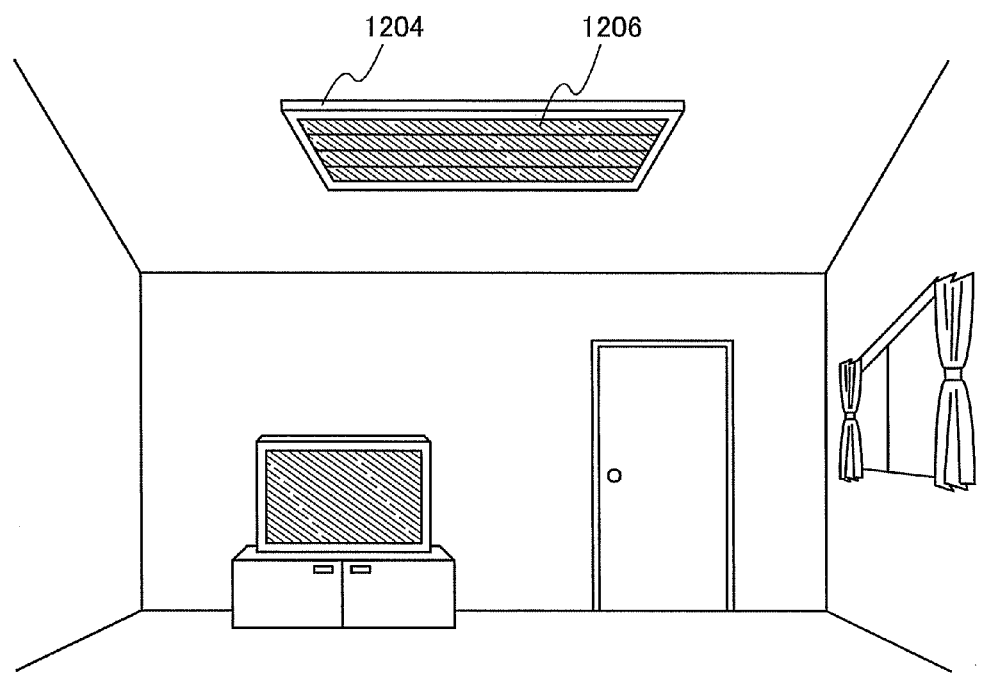

FIG. 8B illustrates an example in which the light-emitting device of an embodiment of the present invention is used as an indoor lighting device. The indoor lighting device includes a housing 1204 and a lighting portion 1206. The light-emitting device of an embodiment of the present invention is used as the lighting portion 1206.

As described above, by using the light-emitting device of an embodiment of the present invention as a lighting device, light energy can be reused; thus, a lighting device with low power consumption and reduced environmental load can be provided.

Embodiment 7 can be implemented in appropriate combination with the structures described in the other embodiments.

This application is based on Japanese Patent Application serial no. 2010-269697 filed with Japan Patent Office on Dec. 2, 2010, the entire contents of which are hereby incorporated by reference.

What is claimed is:

1. A light-emitting device comprising:
a first electrode;
a second electrode;
a first substrate provided with a light-emitting element formed using an organic EL layer sandwiched between the first electrode and the second electrode; and
a second substrate provided with a colored layer and a photoelectric conversion element,
wherein the colored layer is provided to face the light-emitting element and has a light-transmitting property with respect to the light emitted from the light-emitting element which has a particular wave length, and
wherein the photoelectric conversion element is provided so as to surround the peripheral portion of the colored layer.

2. The light-emitting device according to claim 1, wherein the first electrode is formed using a material selected from aluminum, an alloy of aluminum, and silver.

3. The light-emitting device according to claim 1, wherein the photoelectric conversion element has amorphous silicon including a pin junction.

4. The light-emitting device according to claim 1, wherein the photoelectric conversion element has a single crystal semiconductor including a pin junction.

5. An electronic device using the light-emitting device according to claim 1.

6. A lighting device using the light-emitting device according to claim 1.

7. A light-emitting device comprising:
a first electrode;
a second electrode;
a first substrate provided with a light-emitting element formed using an organic EL layer sandwiched between the first electrode and the second electrode;
a second substrate provided with a colored layer and a photoelectric conversion element;
a light-emission control circuit providing electric power to the light-emitting element; and
a power storage portion storing electromotive force of the photoelectric conversion element,
wherein the colored layer is provided to face the light-emitting element and has a light-transmitting property with respect to the light emitted from the light-emitting element which has a particular wave length, and
wherein the photoelectric conversion element is provided so as to surround the peripheral portion of the colored layer.

8. The light-emitting device according to claim 7, wherein the first electrode is formed using a material selected from aluminum, an alloy of aluminum, and silver.

9. The light-emitting device according to claim 7, wherein the photoelectric conversion element has amorphous silicon including a pin junction.

10. The light-emitting device according to claim 7, wherein the photoelectric conversion element has a single crystal semiconductor including a pin junction.

11. An electronic device using the light-emitting device according to claim 7.

12. A lighting device using the light-emitting device according to claim 7.

* * * * *